United States Patent [19]

Glesener et al.

[11] Patent Number: 5,381,755
[45] Date of Patent: Jan. 17, 1995

[54] METHOD OF SYNTHESIZING HIGH QUALITY, DOPED DIAMOND AND DIAMONDS AND DEVICES OBTAINED THEREFROM

[75] Inventors: John W. Glesener, Temple Hills; Arthur A. Merrish, La Plata; Keith A. Snail, Silver Spring, all of Md.

[73] Assignee: The United States of America as represented by the Secretary of the Navy, Washington, D.C.

[21] Appl. No.: 747,321

[22] Filed: Aug. 20, 1991

[51] Int. Cl.[6] ............................................. C30B 29/04
[52] U.S. Cl. ...................................... 117/88; 117/84; 117/89
[58] Field of Search ....... 156/612, 613, 614, DIG. 68; 423/446

[56] References Cited

U.S. PATENT DOCUMENTS

| | | | |
|---|---|---|---|
| 4,938,940 | 7/1990 | Hirose et al. | 156/DIG. 68 |
| 5,023,068 | 6/1991 | Jones | 156/DIG. 68 |
| 5,074,245 | 12/1991 | Ota et al. | 156/DIG. 68 |

OTHER PUBLICATIONS

"The C–V Characteristics of Schottky Barriers On Laboratory Grown Semi-Conducting Diamonds"; Glover; Solid–State Electronics; (1973); vol. 16; pp. 973–983.

Nishimura et al., "Material and Electrical Characterization of Polycrystalline Boron–Doped Diamond Films Grown by Microwave Plasma Chemical Vapor Deposition", J. Appl. Phys. 69(5), 1 Mar. 1991, pp. 3142–3148.

Fujimori et al., "Characterization of Conducting Diamond Films", Vacuum, vol. 36, Nos. 1–3, 1986, pp. 99 to 102.

Poferl et al., "Growth of Boron Doped Diamond Seed Crystals by Vapor Deposition", J. Appl. Phys., vol. 44, No. 4, Apr. 1973, pp. 1428–1434.

Okano et al., "Synthesis of Diamond Thin Films Having Semiconductive–Properties", Japanese Journal of Applied Physics, vol. 27, No. 2, Feb. 1988, pp. L173–L175.

*Primary Examiner*—R. Bruce Breneman
*Assistant Examiner*—Felisa Garrett
*Attorney, Agent, or Firm*—Thomas E. McDonnell; Barry A. Edelberg

[57] ABSTRACT

Diamond crystals and films having a well-controlled amount of dopant therein are synthesized by incorporating a dopant into a deposition species formed from a gaseous source of carbon and a gaseous source of hydrogen. Flame and/or plasma deposition may be used. Various apparatuses for carrying out the growth of the doped diamond are also disclosed.

20 Claims, 8 Drawing Sheets

METHOD OF SYNTHESIZING HIGH QUALITY, DOPED DIAMOND AND DIAMONDS AND DEVICES OBTAINED THEREFROM

BACKGROUND OF THE INVENTION

1. Field of the Invention

The present invention relates generally to the production of synthetic diamonds and diamond materials and more particularly, to the production of doped synthetic diamonds and diamond materials.

2. Description of the Prior Art

Diamond based semiconductors have several desirable properties that include a wide bandgap, high carrier mobility, a large thermal conductivity, and chemical inertness. Diamond electronic devices can potentially operate at much higher temperatures than Si devices, due to the larger bandgap, which reduces the number of thermally excited carriers. The high thermal conductivity of diamond may also permit one to fabricate high power/density devices and circuits of diamond without jeopardizing the performance due to thermally induced temperature increases. Semiconductor photoemitters and photodetectors formed out of diamond have the possibility of operating in regions of the UV not easily accessible to other semiconductor materials. Doped diamond optical devices, such as lasers, also offers exciting possibilities. Creating diamond-based electronic and photonic devices requires an understanding of the electrical properties of diamond along with the capability to grow high quality diamond.

Doped single crystal diamond is available from low pressure chemical vapor deposition (CVD) processes using hydrocarbon gases (see Fujimori, et al., "Characterization of conducting diamond films" *Vacuum*, Vol. 36, Nos. 1-3, pages 99 to 102 (1986), incorporated herein by reference) and from natural sources. Type IIB natural diamonds contain boron, and type IB diamonds contain nitrogen, however natural diamond is not useful for electronic devices because of the inability to control the dopant level. Doping of crystals grown with General Electric's high pressure high temperature (HPHT) process has been reported but the doping profile cannot be tailored and thus this process is not practical. Hence the only practical way of fabricating electronic devices made of diamond is with CVD processes. Current rates for the CVD synthesis of epitaxial diamond are slow ($\sim 1$ micron/hour), and do not always produce high quality diamond.

Recently, several new techniques for the low pressure production of high quality synthetic diamonds by flame and/or plasma torch deposition have been described. These techniques are described in, for example in U.S. patent application Ser. No. 07/587,328, entitled FLAME OR PLASMA SYNTHESIS OF DIAMOND UNDER TURBULENT AND TRANSITION CONDITIONS, filed Sep. 24, 1990 to Snail et al.; U.S. patent application Ser. No. 07/548,719, entitled EPITAXIAL SYNTHESIS OF DIAMOND CRYSTALS AT HIGH GROWTH RATES, filed Jul. 6, 1990 to Snail et al.; Snail et al., *Appl. Phys. Lett.*, 58, 1 (1991); snail and Hanssen, *J. Crystal Gr.*, 112(4) 651 (1991), the entirety of all of which are incorporated herein by reference. In particular, diamonds produced under turbulent and transition conditions (as defined in the above-mentioned Snail et al. '328 patent application, i.e., transition of Reynolds number $\sim 1200$ to 2200 and have been of exceptionally high quality, and monocrystalline, bulk diamonds have been grown epitaxially at high substrate temperatures (about 1200° to about 1500° C.). The Raman spectra of the turbulently grown films shows a noticeable lack of non-diamond carbon peaks and the high luminescence background that had previously been observed with diamond grown in laminar oxy-acetylene flames. The low temperature photoluminescence spectrum of turbulently grown diamond films exhibits no detectable vacancy related complexes, and is dominated by a strong first order Raman phonon line as well as a low, broad almost featureless emission band. To the human eye, undoped films appear white with no tint or discoloration. The lack of localized electrical defects, as shown by optical measurements indicates that this particular growth technique can produce diamond suitable for electronic applications, especially if they can be doped in a controlled manner. Since the Debye temperature for diamond is 1600° C., processes for growing diamond epitaxially at high temperatures (1200°-1600° C.) with laminar or turbulent flames and plasma torches permits higher doping efficiencies and dopant levels compared to lower temperature deposition processes.

SUMMARY OF THE INVENTION

Accordingly, it is an object of this invention to produce doped diamond and diamond films of high quality.

It is another object of the present invention to reliably dope diamond and diamond films in a controlled manner.

It is a further object of the present invention to provide electronic devices including doped diamond or diamond films.

These and additional objects of the invention are accomplished by incorporating a predetermined amount of dopant into the source gas of a flame or plasma torch during flame or plasma synthesis of diamond.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIG. 1a is a schematic cross-section showing a device made according to the present invention with the apparatus shown in FIG. 1. The device includes both an ohmic contact and a Schottky contact.

DESCRIPTION OF THE PREFERRED EMBODIMENTS

Figure 1:
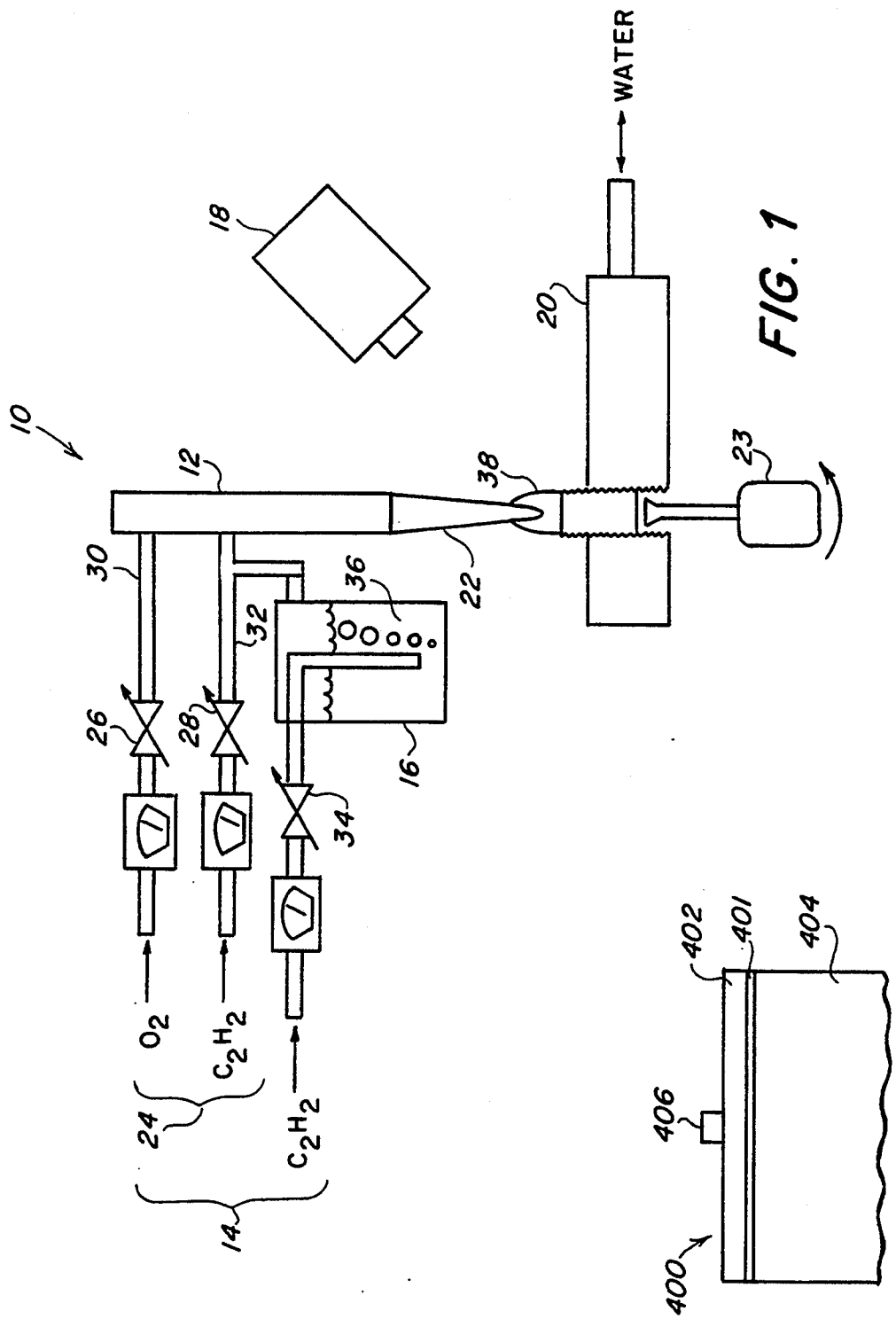
FIG. 1 shows an apparatus for the flame deposition of doped diamond and diamond films according to the present invention.

Diamond or diamond film is grown on a surface by a flame and/or plasma torch method. These techniques are described in the above-mentioned U.S. patent application Ser. No. 07/587,328 and U.S. patent application Ser. No. 07/548,719. In these techniques, a source gas including hydrogen and carbon (either a single gas or a mixture of gases, with one of the gases even possibly being molecular hydrogen), typically acetylene, is mixed with a source of oxygen (typically $O_2$ gas) and reacted, under combustion conditions, or mixed with an inert gas such as Ar and reacted under plasma conditions, to grow diamond on an appropriate substrate. Any substrate as described in the above patents or the open literature (for example, heteroepitaxial or mosaic diamond, including HPHT diamond and natural diamond) may be used according to the present invention, as long as it can withstand chemical attack by oxygen at the substrate temperatures used.

Doping can be achieved by mixing a predetermined amount of dopant with at least one of the gases reacted to form the diamond or diamond film. Preferably, the dopant is mixed with a hydrocarbon feed gas. Introduction of the dopant into one of the reactant gases can be achieved by any means. For example, one of the following techniques may be used:

a) Bubbler techniques: The dopant material (if not an element within a liquid through which source gas may be bubbled) is dissolved into a hydrocarbon or oxyhydrocarbon solvent or water and introduced into the source gas as a vapor, by bubbling the gas through the solvent.

In this technique, the amount of dopant incorporated into the gas stream and thus into the growing diamond or diamond film may controlled by varying the rate at which the gas is bubbled through the dopant solution and/or by varying the concentration of the dopant solution. Preferably, the concentration of the dopant solution is used to set the coarse dopant level and the fine control of the dopant level is achieved by varying the flow rate of the gas through the dopant solution, since it is simpler to vary dopant concentrations and obtain a finely controlled dopant profile within the growing diamond or diamond film by varying flow rate that by changing the concentration of the doping solution. While it is generally unnecessary, it may be desirable in this technique to provide a conventional means of monitoring and maintaining a constant concentration of dopant in the bubbling solution to avoid variations that may arise from preferential evaporation of the solvent from the dopant solution.

b) Ultrasonic nebulization: the dopant (if not an element within a liquid which may be nebulized) is dissolved into a hydrocarbon or oxyhydrocarbon solvent or water and nebulized dopant solution (i.e. atomized) with an ultrasonic device. The gas is flowed above the nebulized dopant, entraining a fine spray of the dopant.

In this technique, the amount of dopant incorporated into the gas stream and thus into the growing diamond or diamond film is controlled by varying the velocity at which the gas is flowed above the nebulized dopant solution (and thus the rate at which the gas entrains the dopant), varying the concentration of the dopant solution, and/or varying the amount of nebulized dopant solution available for entrainment. If the velocity, but not flow rate of the gas over the nebulized solution is increased, the gas will have a larger concentration of dopant. Increasing the flow rate in addition to the velocity of the gas may partially or completely counter this increase.

c) Atomization: the dopant is dissolved (if not an element within a liquid which may be atomized) into a hydrocarbon or oxyhydrocarbon solvent or water and added to the source gas by spraying with an atomizer.

In this technique, the amount of dopant incorporated into the gas stream and thus into the growing diamond or diamond film is controlled by varying the velocity at which the gas is flowed in the atomized stream of dopant solution, varying the concentration of the dopant solution, and/or varying the amount of atomized dopant solution flowed into the gas. Here, as is the case with nebulization, increasing the flow rate in addition to the velocity of the gas may partially or completely counter the increase in the dopant concentration of the gas.

d) Evaporation: a thin strand of solid dopant material is introduced, at a controlled rate, into the flame or plasma jet and allowed to evaporate at a controlled rate.

In this technique, the amount of dopant incorporated into the flame or plasma jet and thus into the growing diamond or diamond film is controlled by varying the rate at which the solid dopant evaporates. Typically, this rate may be controlled by varying the temperature of the flame or plasma jet, varying the velocity of the plasma jet and/or by geometrically varying the surface area of the solid dopant exposed to the flame or plasma jet.

e) Gaseous dopant sources. When a dopant is available in a gaseous form (e.g. $B_2H_6$) which is compatible with the deposition process, the dopant can be simply added to the source gas.

Here, control of the amount of dopant incorporated into the flame or plasma jet and thus into the growing diamond or diamond film is direct and self-explanatory.

f) Arc erosion: the electrodes of a plasma torch can be coated with the dopant material.

Erosion can be controlled by proper design of the plasma torch electrodes and/or control of the gas composition adjacent to the electrode.

The concentration of the dopant may vary depending upon the desired end product. For example, the dopant concentrations for contacts is typically from about 0.1 to about 5 atomic percent, preferably about 0.5 to about 5 atomic percent, and most preferably about 1 to about 5 atomic percent. The dopant concentration for active electrical devices are typically about 1 atom ppm to about 500 atom ppm, preferably about 50 atom ppm to about 500 atom ppm and most preferably about 100 to about 500 atom ppm.

Any dopant can be added to diamond by the method of present invention. Possible dopants for diamond include, but are not limited to, B (from $B_2O_3$), P (from $P_2O_5$), Cr, and lanthanides such as Nd and Er. Even if a dopant cannot control the electrical properties of diamond, it may still provide diamond with useful optical properties. These optical properties could make the doped diamond useful as, for example, lasers.

Once the doped film/crystal is grown, electrical contacts need to be formed to it for device applications. In some instances, the diamond can be grown on a metallic layer, forming a Schottky or ohmic contact.

FIG. 1 shows an apparatus useful according to the present invention for the flame deposition of doped diamonds and diamond films. The structure and function of this apparatus is explained in the EXAMPLES section below.

Figure 2:
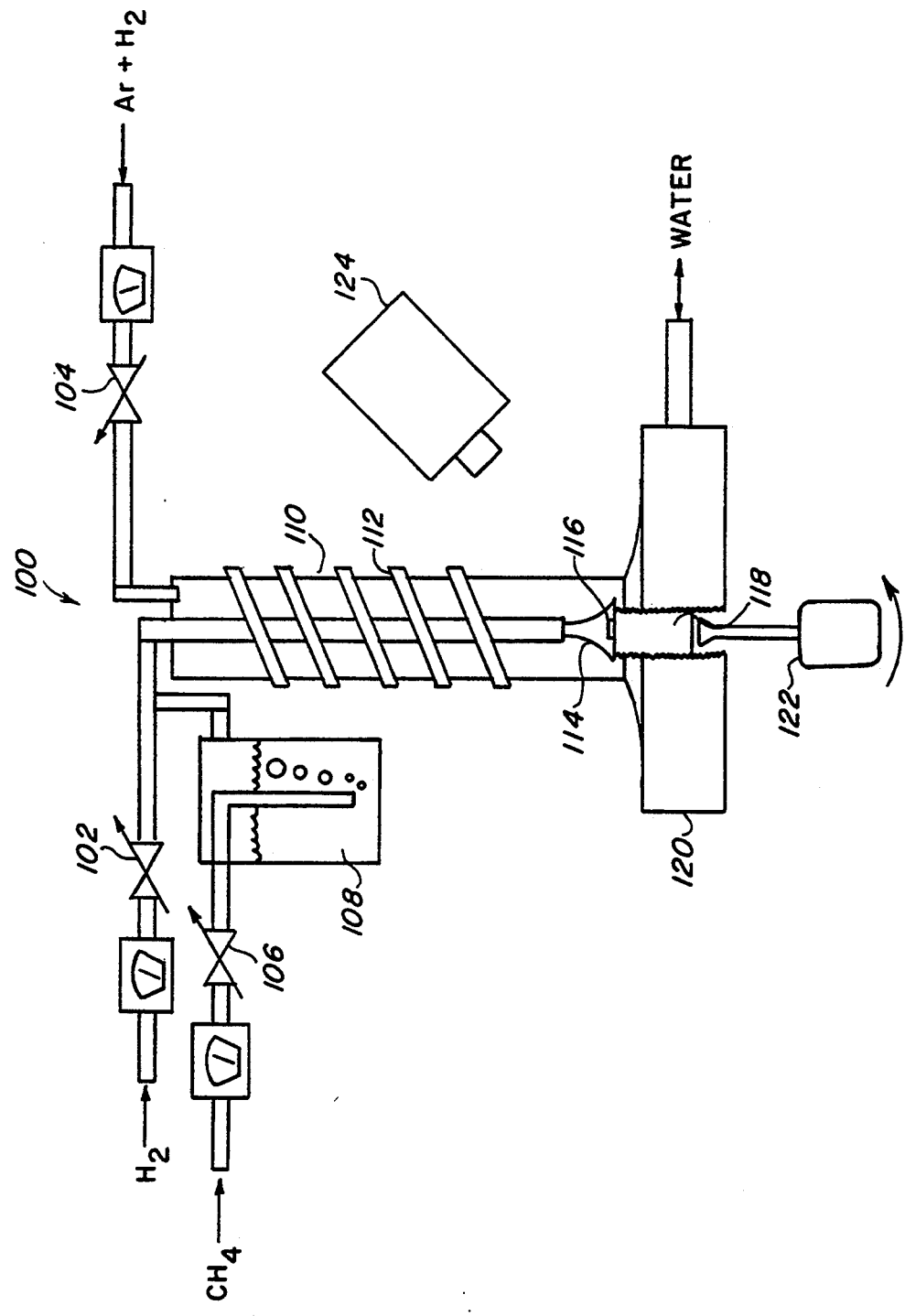
FIG. 2 shows an apparatus for the rf plasma torch deposition of doped diamond and diamond films according to the present invention.

FIG. 2 shows an apparatus 100 useful according to the present invention for the rf plasma torch deposition of doped diamonds and diamond films. Essentially pure hydrogen gas is supplied through mass flow controller and a mixture of hydrogen and diluent gas is supplied by mass flow controller 104. Methane gas from mass flow controller 106 is bubbled through a solution of dopant 108, typically in a hydrocarbon or oxyhydrocarbon solvent (an oxyhydrocarbon solvent is defined, for the purpose of the present specification and claims, as a solvent compound including H, C and O, and no other elements) such as methanol, ethanol, acetone, or a mixture thereof, or water, or a mixture of the hydrocarbon and/or oxyhydrocarbon solvent and water. Of course, if the dopant is an element within a compound which is a liquid through which source gas may be bubbled, then no solvent may be need. As used in the specification and claims, the term "dopant solution" includes dopants that are elements within liquids and dopants which require the presence of a separate solvent. The $H_2$ from controller 102 and the $CH_4$ from controller 106, containing dopant solution from bubbling through solution 108, are mixed prior to entering chamber 110, where they mix with the stream of inert gas (Ar) and $H_2$. Once in chamber 110, the gases are exposed to rf energy from rf coils and a plasma is generated. The plasma exits chamber 110 through jet nozzle 114. Diamond is thus grown upon seed crystal 116. Seed crystal 116 is maintained at the desired temperature (about 1100° to about 1600° C., and preferably at about 1200° to about 1500° C.) by controlling the temperature of the screw-threaded holder 118 with a water-cooled copper mount. The distance between the growing diamond and nozzle 114 is controlled by rotating a screwdriver 122. The optics of two-color pyrometer 124 were aligned with the center of seed crystal 116.

Figure 3:
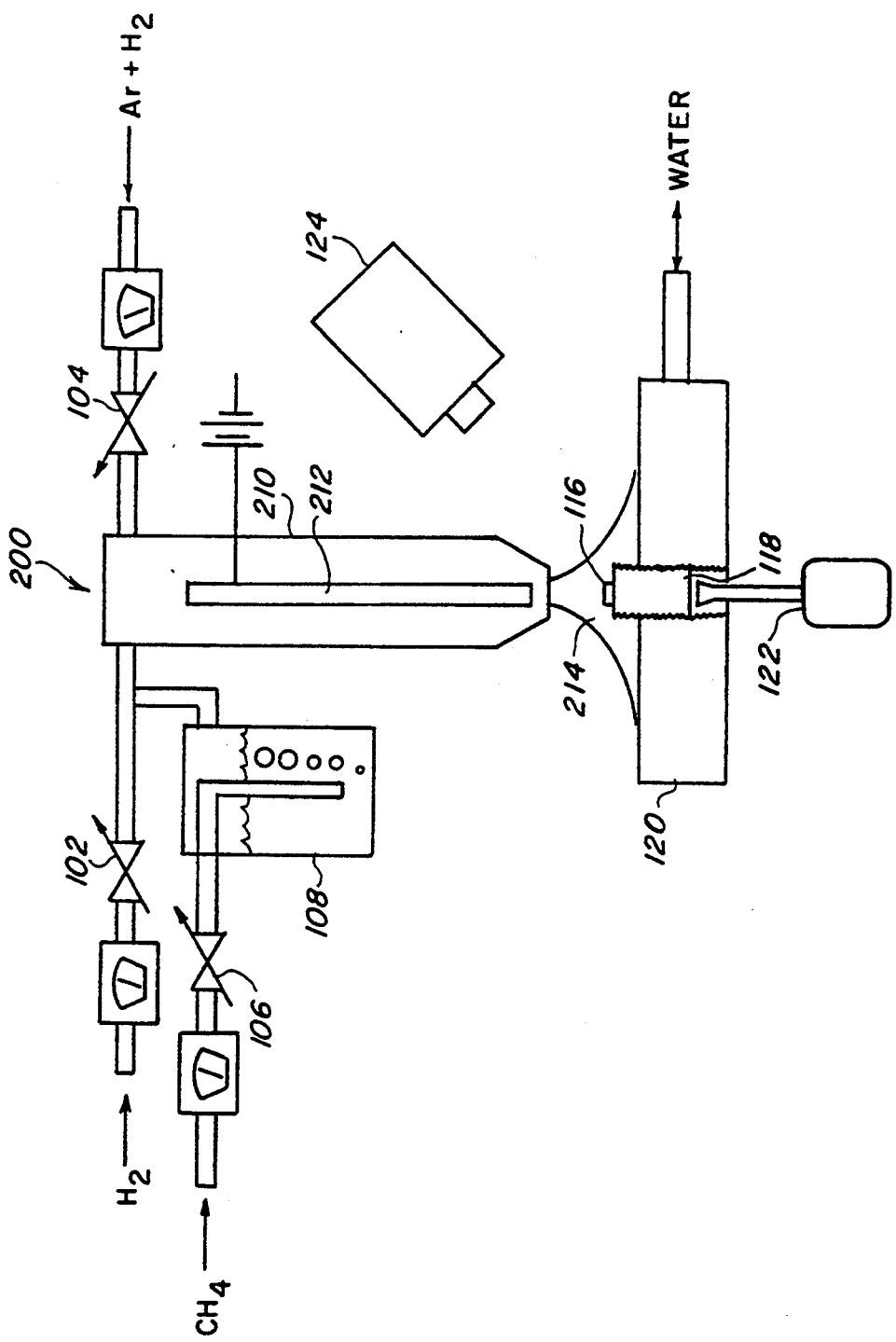
FIG. 3 shows an apparatus for the dc plasma torch deposition of doped diamond and diamond films according to the present invention, the dopant being added by the use of a bubbler.

FIG. 3, which shows an apparatus 200 useful according to the present invention for the dc plasma torch deposition of doped diamonds and diamond films, is essentially the same as FIG. 2. No rf coil is used. Instead, chamber 210 includes a cathode 212, which, upon discharge, creates a plasma from the gases in the chamber. The plasma exits through jet nozzle 214. Other parts are labelled as in the apparatus of FIG. 2 and are essentially the same as described with in the above discussion of that apparatus.

Figure 4:
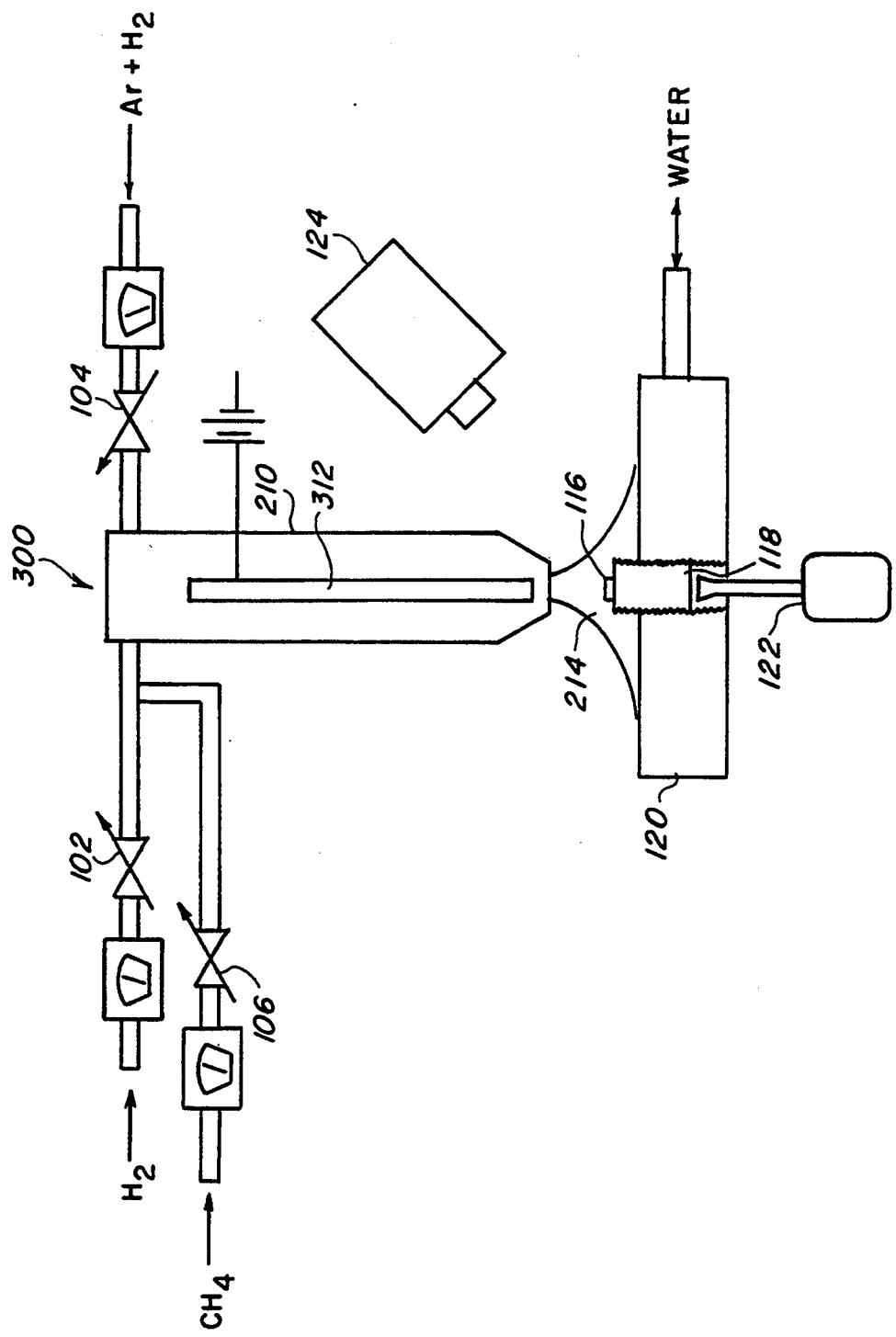
FIG. 4 shows an apparatus for the dc plasma torch deposition of doped diamond and diamond films according to the present invention, the dopant being added by the use of a coated discharge electrode.

FIG. 4, which shows an apparatus 300 useful according to the present invention for the dc plasma torch deposition of doped diamonds and diamond films, is essentially the same as FIG. 3. No bubbler is used. Instead, the dopant is provided by the erosion of discharge electrode 312, which acts in essentially the same manner as discharge electrode 212 of FIG. 3, but is coated with the desired dopant. Other parts are labelled as in the apparatus of FIG. 3 and are essentially the same as described with in the above discussion of that apparatus.

Having described the invention, the following examples are given to illustrate specific applications of the invention including the best mode now known to perform the invention. These specific examples are not intended to limit the scope of the invention described in this application.

EXAMPLES

As shown in FIG. 1, a deposition set-up 10 for use according to the present invention consisted of an oxygen/acetylene torch 12, a mass flow controller system 14, a bubbler 16, a two color pyrometer 18, and a water cooled substrate holder 20. The torch 12 had a welding tip 22 with an exit diameter of 1.85 mm. The main gas delivery system 24 consisted of two flow controllers, 26 and 28 each attached to a gas manifold, 30 and 32, respectively. The purity of the process gases used was 99.99% and 99.6% for the oxygen and acetylene, respectively. A third flow controller 34 was used to send acetylene through a methanol/boric oxide/boric oxide solution 36. This controller was used to control the amount of boron present in the deposited films. The flow rates for the three controllers were 6.47 lpm/5.97 lpm/0.085 lpm, respectively. Prior to the deposition, the Mo substrate 38 was threaded into water cooled copper substrate holder 20. The distance between the growing diamond and tip 22 was adjusted by rotating a screw driver 23. The optics of pyrometer 18 were aligned with the center of substrate 38. The temperature of substrate 38 ranged between 980° C. to 1020° C. during growth. The diamond films characterized in this work had a thickness of approximately 10 microns.

Initially, any diamond film grown on the Mo substrate would immediately separate upon completion of the growth and removal of the torch. This difficulty was addressed, as shown in FIG. 1a, by placing a metallic buffer layer 401 between the diamond film 402 and the Mo substrate 404. This layer would promote interfacial adhesion and also function as an ohmic contact to the diamond. Metals forming refractory carbides were investigated because of their strength and low resistivity. A chromium/titanium alloy contact was found to meet the above criteria. Varying the alloy composition was found to be a technique that allowed a shift in the carbide formation rate. This carbide formation rate could be adjusted to the planned substrate growth temperature. The alloy films were made by evaporation on the Mo screw surface, using a dual gun e-beam evaporator. The metallic interfacial layer 401 used in this work had a composition of 70% Cr/30% Ti thickness of 0.5 microns. Prior to deposition, the alloy coated Mo substrate was scratched with 0.1 micron diamond paste and then cleaned ultrasonically in an acetone bath.

Figure 5:
FIG. 5 is a scanning electron micrograph (SEM) of the center of a diamond film made using the apparatus of FIG. 1.

After growth, the top titanium Schottky contact 406 was evaporated onto the diamond 402 at a temperature of 300 K. No annealing or processing steps other than evaporating metal or depositing diamond were performed on the finished devices (see FIG. 1a). After fabrication, the diamond film 402 was examined with scanning electron microscopy (SEM), Raman spectroscopy, and with electrical measurements. An SEM of the center of the film is shown in FIG. 5. A grain size of 2-4 microns can be seen along with extensive twinning. Electrical measurements were used to determine the activation energy of the boron acceptor and the I-V characteristics.

Figure 6:
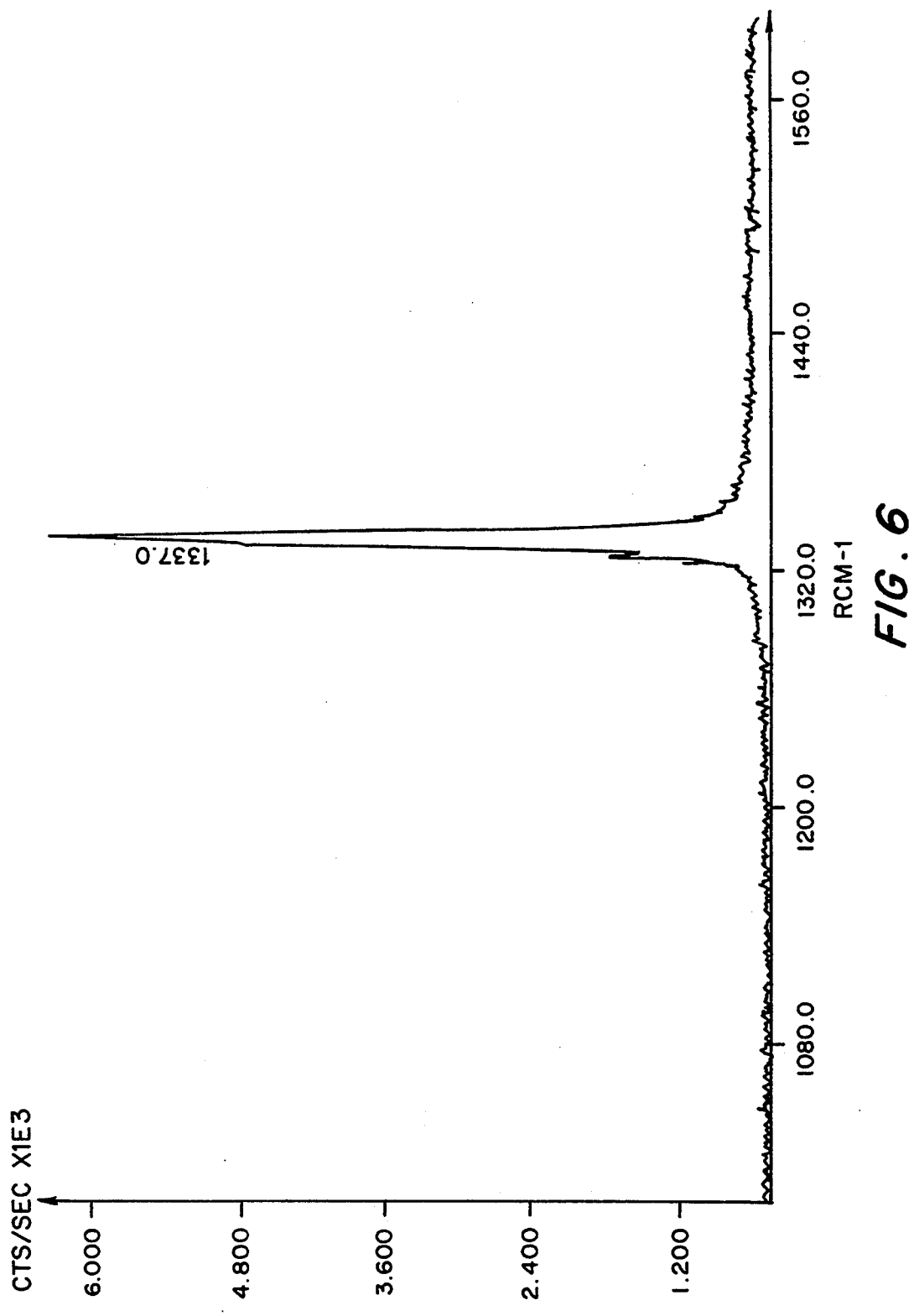
FIG. 6 shows the Raman spectra of a doped diamond film grown with the system shown in FIG. 1.
Figure 7:
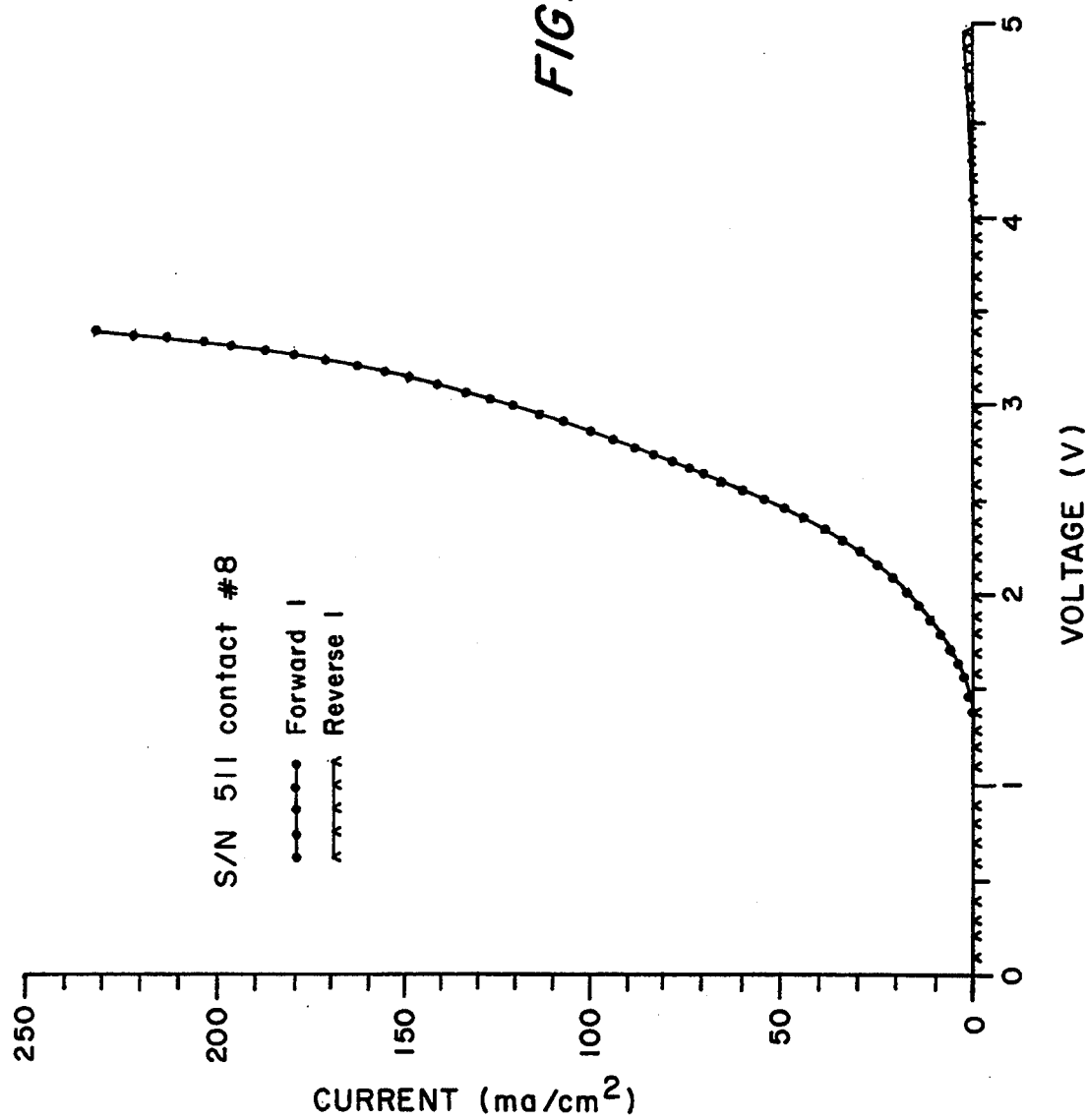
FIG. 7 shows an I-V curve measured for Schottky diode made using the apparatus of FIG. 1.
Figure 8:
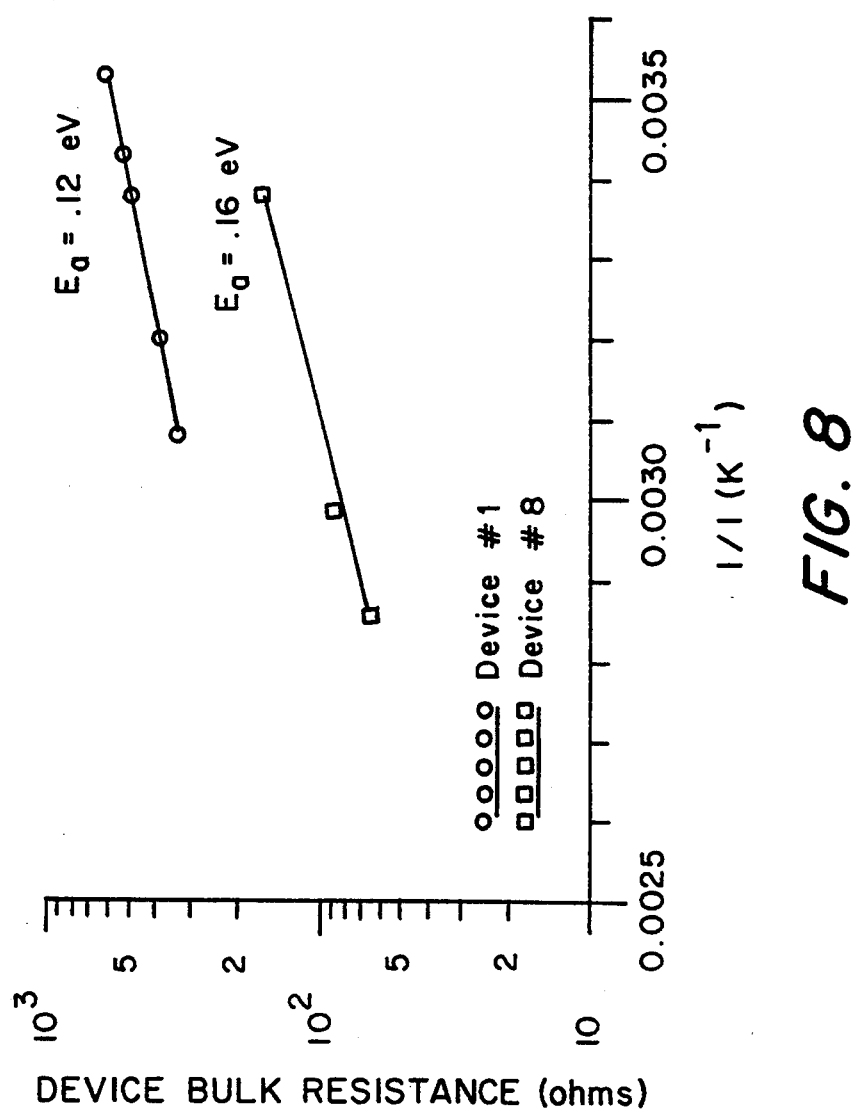
FIG. 8 shows the bulk resistance, as a function of $T^{-1}$, for two devices made according to the present invention.

The micro-Raman spectra of the boron doped diamond film is shown in FIG. 6. A laser power of 30 mW was used and the excitation wavelength was 488 nm. The laser spot size used was 10 microns and the diamond substrate was sampled in the center. The peak in the Raman spectrum was centered at 1337 cm$^{-1}$ and has a FWHM of 9 cm$^{-1}$. As can be seen from the spectrum there is a low level of background luminescence. This lack of luminescence would indicate a low number of defect states or levels in the bandgap. Lee et. al, *Appl. Phys. Lett.* 57, 1916 (1990), incorporated herein by reference, have correlated the characteristics of the Raman polycrystalline diamond peak with the properties of the diamond/metal interface. The broadening of the Raman peak in FIG. 6 is thus associated with the lattice mismatch between the substrate and the diamond film. The 5 cm$^{-1}$ shift of the diamond peak is due to strain produced in the film upon cooling. Films that have been grown in a turbulent flame and have separated from the Mo substrate show no evidence of a shift. The geometry of the device 400 illustrated schematically in FIG. 1a, was an asymmetrical sandwich structure with the alloy coated Mo screw 404 serving as the ohmic bottom contact and a Ti dot 406 as the Schottky contact to the B-doped diamond film 402. The bottom contact was 1.25 cm in diameter and the top contact was 1 mm in diameter. The current-voltage measurements were taken at room temperature and the results of these measurements are shown in FIG. 7. From the data, the rectification ratio at 5 volts was found to be greater than 300. The I-V curve was measured quasi-statically with a DC voltage source and two digital volt meters. The I-V characteristic beyond six volts was linear. This linearity was used to determine the diamond film bulk resistance. This bulk resistance was then measured as a function of temperature, from which an activation energy level was deduced. The bulk resistance for two devices from the same film as a function of T$^{-1}$ is shown in FIG. 8.

EXAMPLE 2

The apparatus of FIG. 1, and the general procedure described in Example 1, were used to deposit diamond on a {100} type IIA natural diamond at 1300° C. Deposition proceeded for 1 hr. Dopant was incorporated, as in Example 1, by use of a bubbler. The flow rate for O$_2$ was 10.3 slm and for C$_2$H$_2$ was 10.0 slm. The flow rate through the bubbler was 0.085 slm.

The procedure of Example 2 was followed, with the exception that the dopant solution was P$_2$O$_5$ in methanol (n-type dopant).

Obviously, many modifications and variations of the present invention are possible in light of the above teachings. It is therefore to be understood that, within the scope of the appended claims, the invention may be practiced otherwise than as specifically described.

What is claimed is:

1. A method of growing a doped diamond film comprising the steps of:
   flowing together a gaseous carbon source, oxygen and a gaseous hydrogen source to form a mixture;
   combusting the mixture to form a deposition species;
   including a dopant in said deposition species;
   directing a flow of said deposition species, including said dopant, to a surface of a substrate for deposition of diamond; and
   maintaining the substrate at a temperature for the deposition of diamond while said flow of said deposition species is directed thereto, thereby inducing deposition of a doped diamond film on the substrate.

2. The method of claim 1, wherein said flow of said deposition species is turbulent.

3. The method of claim 2, wherein said dopant is included in said gaseous carbon source by bubbling said gaseous carbon source through a solution of said dopant.

4. The method of claim 1, wherein said solution includes a solvent for said dopant selected from the group consisting of hydrocarbon solvents, oxyhydrocarbon solvents and water.

5. The method of claim 2, wherein said dopant is included in said gaseous carbon source by flowing said gaseous carbon source over a solution of said dopant.

6. The method of claim 5, wherein said solution includes a solvent for said dopant selected from the group consisting of hydrocarbon solvents, oxyhydrocarbon solvents and water.

7. The method of claim 2, wherein said dopant is included in said gaseous carbon source by flowing said gaseous carbon source over a fine spray of a solution of said dopant.

8. The method of claim 2, wherein said dopant is included in said gaseous carbon source by spraying a solution of said dopant into said gaseous carbon source.

9. The method of claim 2, wherein said dopant is included in said deposition species by introducing, at a controlled rate, a thin strand of solid dopant material in the flow of the deposition species, whereby said solid dopant evaporates at a controlled rate.

10. The method of claim 1, wherein said dopant is included in said deposition species by including said dopant in said gaseous carbon source.

11. The method of claim 1, wherein said dopant is included in said gaseous carbon source by bubbling said gaseous carbon source through a solution of said dopant.

12. The method of claim 11, wherein said solution includes a solvent for said dopant selected from the group consisting of hydrocarbon solvents, oxyhydrocarbon solvents and water.

13. The method of claim 1, wherein said dopant is included in said gaseous carbon source by flowing said gaseous carbon source over a solution of said dopant.

14. The method of claim 13, wherein said solution includes a solvent for said dopant selected from the group consisting of hydrocarbon solvents, oxyhydrocarbon solvents and water.

15. The method of claim 1, wherein said dopant is included in said gaseous carbon source by flowing said gaseous carbon source over a fine spray of a solution of said dopant.

16. The method of claim 1, wherein said dopant is included in said gaseous carbon source by spraying a solution of said dopant into said gaseous carbon source.

17. The method of claim 1, wherein said dopant is included in said deposition species by introducing, at a controlled rate, a thin strand of solid dopant material in the flow of the deposition species, whereby said solid dopant evaporates at a controlled rate.

18. A method for forming a Schottky contact having a preselected dopant profile, comprising the steps of:
   growing a doped diamond film by:
      flowing together a gaseous carbon source, oxygen and a gaseous hydrogen source to form a mixture;
      combusting the mixture to form a deposition species;
      including a dopant in said deposition species;

directing a flow of said deposition species, including said dopant, to a surface of a substrate for deposition of diamond;

controlling the amount of said dopant in said deposition species;

maintaining the substrate at a temperature from 1100° C. to 1600° C. for the deposition of diamond while said flow of said deposition species is directed thereto, thereby inducing deposition of a doped diamond film on the substrate, whereby said controlling step provides said doped diamond film with said preselected dopant profile;

evaporating a Schottky contact on a top surface of said doped diamond film.

19. A method of growing a diamond film having a preselected dopant profile, comprising the steps of:

flowing together a gaseous carbon source, oxygen and a gaseous hydrogen source to form a mixture;

combusting the mixture to form a deposition species;

including a dopant in said deposition species;

directing a flow of said deposition species, including said dopant, to a surface of a substrate for deposition of diamond;

controlling the amount of said dopant in said deposition species;

maintaining the substrate at a temperature from 1100° C. to 1600° C. for the deposition of diamond while said flow of said deposition species is directed thereto, thereby inducing deposition of a doped diamond film on the substrate;

whereby said controlling step provides said doped diamond film with said preselected dopant profile.

20. A method for forming a Schottky contact having a preselected dopant profile, comprising the steps of:

growing a doped diamond film by:

flowing together a gaseous carbon source, oxygen and a gaseous hydrogen source to form a mixture;

combusting the mixture to form a deposition species;

including a dopant in said deposition species;

directing a flow of said deposition species, including said dopant, to a surface of a substrate for deposition of diamond;

controlling the amount of said dopant in said deposition species;

maintaining the substrate at a temperature from 1100° C. to 1600° C. for the deposition of diamond while said flow of said deposition species is directed thereto, thereby inducing deposition of a doped diamond film on the substrate, whereby said controlling step provides said doped diamond film with said preselected dopant profile;

evaporating a Schottky contact on a top surface of said doped diamond film.

* * * * *

UNITED STATES PATENT AND TRADEMARK OFFICE
CERTIFICATE OF CORRECTION

PATENT NO. : 5,381,755

DATED : January 17, 1995

INVENTOR(S) : John W. Glesener, Arthur A. Morrish and Keith A. Snail

It is certified that error appears in the above-identified patent and that said Letters Patent is hereby corrected as shown below:

Title page, Item 75, line 2 change "Arthur A. Merrish", to --Arthur A. Morrish--.

Signed and Sealed this

Eleventh Day of April, 1995

Attest:

BRUCE LEHMAN

Attesting Officer

Commissioner of Patents and Trademarks